(12) United States Patent
Hashimoto

(10) Patent No.: US 6,808,578 B2
(45) Date of Patent: Oct. 26, 2004

(54) METHOD FOR PRODUCING CERAMIC SUBSTRATE

(75) Inventor: Akira Hashimoto, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 74 days.

(21) Appl. No.: 10/049,170

(22) PCT Filed: Jun. 7, 2001

(86) PCT No.: PCT/JP01/04818
§ 371 (c)(1),
(2), (4) Date: May 22, 2002

(87) PCT Pub. No.: WO01/95681
PCT Pub. Date: Dec. 13, 2001

(65) Prior Publication Data
US 2002/0170660 A1 Nov. 21, 2002

(30) Foreign Application Priority Data
Jun. 7, 2000 (JP) ........................ 2000-170117

(51) Int. Cl.$^7$ ............................ B32B 31/20; H05K 3/20
(52) U.S. Cl. ................. 156/89.12; 156/89.16; 156/233; 156/235; 156/241
(58) Field of Search ............... 156/89.12, 89.16, 156/182, 230, 233, 235

(56) References Cited

U.S. PATENT DOCUMENTS

| | | | |
|---|---|---|---|
| 5,254,191 A | * 10/1993 | Mikeska et al. | 156/89.15 |
| 5,609,704 A | * 3/1997 | Hayama et al. | 156/89.16 |
| 6,051,448 A | * 4/2000 | Hayama et al. | 438/108 |
| 6,132,543 A | * 10/2000 | Mohri et al. | 156/89.12 |
| 6,374,733 B1 | * 4/2002 | Hayama et al. | 101/170 |
| 6,429,114 B1 | * 8/2002 | Hayama et al. | 438/616 |
| 2002/0094604 A1 | * 7/2002 | Hayama et al. | 438/108 |

FOREIGN PATENT DOCUMENTS

| | | | |
|---|---|---|---|
| EP | 0 405 947 | * | 1/1991 |
| JP | 50-127174 | | 10/1975 |
| JP | 60-160691 | | 8/1985 |
| JP | 9-162066 | * | 6/1997 |
| JP | 11-121645 | * | 4/1999 |

OTHER PUBLICATIONS

International Search Report corresponding to application No. PCT/JP01/04818 dated Sep. 11, 2001.
English translation of Form PCT/ISA/210.

* cited by examiner

Primary Examiner—Melvin C. Mayes
(74) Attorney, Agent, or Firm—RatnerPrestia

(57) ABSTRACT

A method for manufacturing a ceramic circuit substrates having a high-density conductive pattern, as its internal conductor, formed by a film-intaglio-transfer-printing method is provided. The conductive pattern is temporarily transfer-printed on a heat-resistant substrate coated with an adhesive layer. An un-sintered ceramic green sheet is stacked on a surface of the conductive patterns of the heat-resistant substrate, and then, the conductive pattern is transfer-printed again onto the un-sintered ceramic green sheet like being embedded by heat-pressing. Consequently, the conductive pattern is formed on the green sheet. This then has a binder removed and is sintered, and provides the ceramic circuit substrate having the fine, high-density conductive patterns, as the internal conductor, formed by the film-intaglio-transfer-printing method.

16 Claims, 9 Drawing Sheets (2a)

(2b)

(2c)

(8a)

(8b)

(8c)

METHOD FOR PRODUCING CERAMIC SUBSTRATE

THIS APPLICATION IS A U.S. NATIONAL PHASE APPLICATION OF PCT INTERNATIONAL APPLICATION PCT/JP01/04818.

TECHNICAL FIELD

The present invention relates to a method for manufacturing a ceramic substrate.

BACKGROUND ART

A low-temperature-sintered ceramic (LTC) substrate among multi-layer ceramic circuit substrates is recently used for down-sized components in electronic appliances such as personal computers or cellular phones. This type of the multi-layer ceramic circuit substrate is formed by a method in which ceramic green sheets (GS's) which is not sintered are stacked, i.e., a GS stacking method. As a method of forming conductive patterns, a screen printing method is generally applied for forming internal interconnections. A screen printing method, thin film photolithography or thick film photolithography is generally known for forming surface electrical connections on ceramic substrates.

Appliances such as cellular phones require down-sized, light electronic components. An LCR hybrid circuit substrate which forms a filter including inductors, capacitors, and resistors incorporated in a multi-layer ceramic substrate thereof is developed as a printed circuit board. A fine line pattern technology is required because the elements such as LCR and internal conductive patterns are formed by a screen printing method.

A current screen printing method, however, can provide a line pitch (wire diameter+clearance) of 100 $\mu$m at the narrowest at a mass-production stage.

A conventional method for manufacturing multi-layer ceramic circuit substrates formed with green sheets will be described with referring to FIG. 9. At step 9a, through-holes 92 are punched in an un-sintered ceramic green sheet 91 with a puncher, piercing die or YAG laser apparatus or the like. At step 9b, the through-holes 92 of the green sheet 91 are filled with conductive paste, and via-hole conductors 93 are then formed by a screen printing method or the like with metal screen plates. At step 9c, conductive patterns 94 are formed on the green sheet 91 with conductive paste by a screen printing method. At step 9d, plural green sheets 91 are stacked and heat-pressed, thus being integrated. At step 9e, a de-binder process for removing a binder and a sintering process are applied to the stacked assembly. Then, the green sheet 91 becomes a sintered ceramic substrate 95, and the via conductors 93 and conductive patterns 94 become sintered via conductors 96 and sintered conductive patterns 97, respectively. The conductive pattern has a thickness ranging approximately 7 to 8 $\mu$m.

The conventional screen printing method can provide a pitch of 100 $\mu$m at the narrowest in internal conductive patterns As a method for forming high-density conductive patterns on ceramic substrates, a film-intaglio-transfer-printing method is well known. The printing method provides both very fine line patterns (approximately 40 $\mu$m pitch between wires) and a high aspect ratio (approximately 10 $\mu$m thickness after the sintering). The film-intaglio-transfer-printing method can be applied to manufacturing ceramic circuit substrates in two manners.

In one manner, a multi-layer ceramic circuit substrate is manufactured by stacking the GS's having conductive patterns formed by the film-intaglio-transfer-printing method. In the other manner, the multi-layer ceramic circuit substrate is manufactured by stacking sintered ceramic substrates having conductive patterns formed by the film-intaglio-transfer-printing method and un-sintered green sheets alternatively.

When, however, the conductive patterns are transfer-printed directly onto the GS's by the film-intaglio-transfer-printing method, a surfaces of the GS's are necessarily coated with an adhesive layer composed mainly of thermoplastic resin. However, the GS's can not be coated with the adhesive layer because an organic solvent dissolves the adhesive layer. In addition to this, the un-sintered green sheets and sintered ceramic substrates, upon being stacked alternatively, may hardly be adhered with each other, and thus, may be de-stacked between the sheets during being heat-pressed, having the binder removed, or being sintered.

DISCLOSURE OF THE INVENTION

A method of manufacturing a ceramic circuit substrate having a fine conductive pattern as an internal conductive pattern formed by a film-intaglio-transfer-printing method is provided.

The manufacturing method includes the following steps:
(a) Filling an intaglio with a conductive paste to form the conductive pattern by the film-intaglio-transfer-printing method;
(b) Forming an adhesive layer on a heat-resistant substrate;
(c) Heat-pressing the intaglio on the adhesive layer
(d) Removing the intaglio; and
(e) Forming an assembly through heat-pressing an un-sintered green sheets covering the conductive pattern. The assembly has a binder removed and is sintered, and thus, provides a ceramic substrate.

DESCRIPTION OF THE PREFERRED EMBODIMENTS (Embodiment 1)

Figure 1:
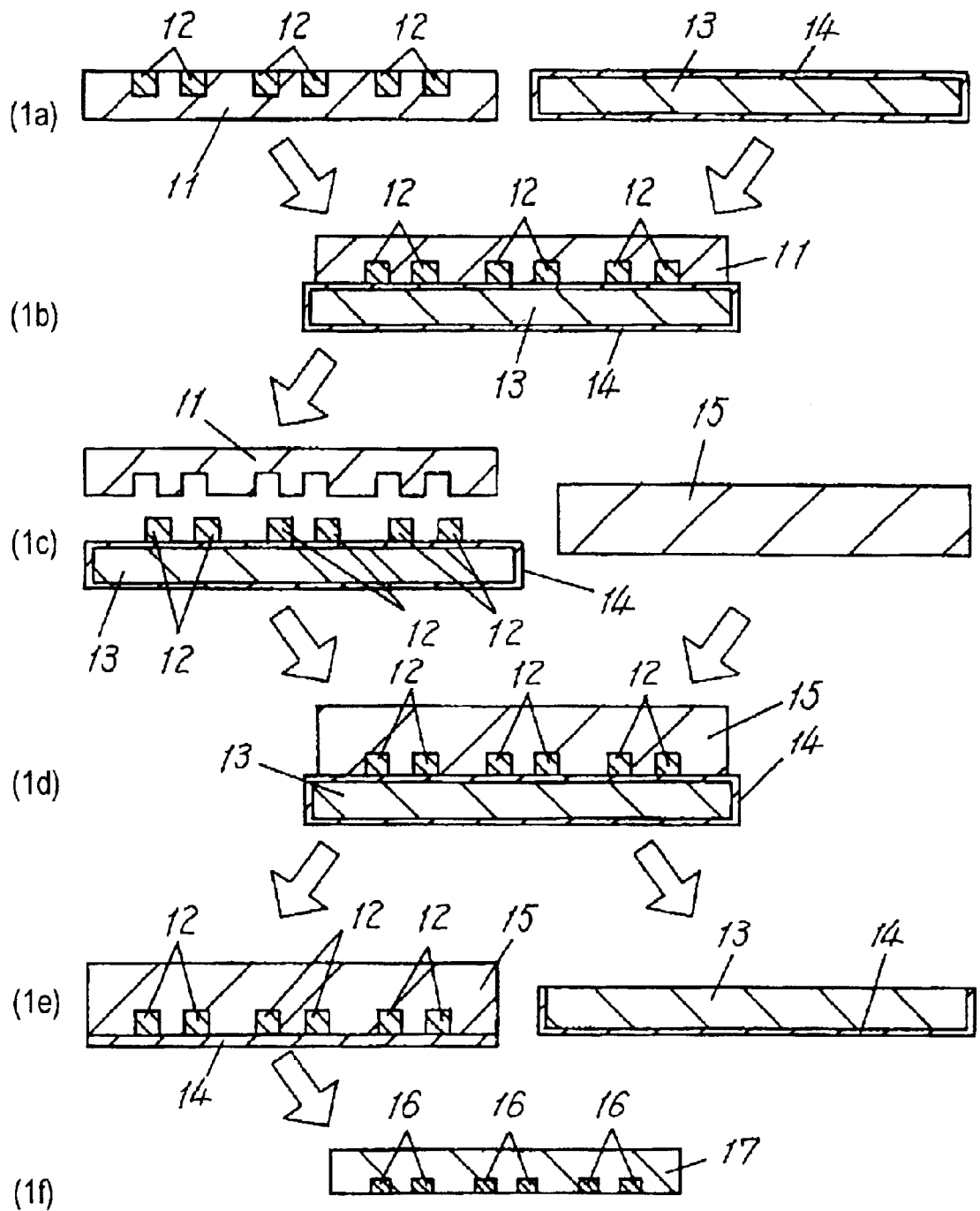
FIG. 1 illustrates sectional views of a ceramic substrate in a manufacturing process according to Embodiment 1 of the present invention.

FIG. 1 illustrates a method for manufacturing a ceramic circuit substrate in accordance with exemplary embodiment 1 of the present invention. A conductive pattern is formed on an un-sintered ceramic green sheet (hereafter referred to as GS) by a film-intaglio-transfer-printing method.

At step 1a, a polyimide intaglio 11 having grooves formed with excimer laser has the grooves filled with conductive paste 12 with a ceramic blade or the like. As the volume of the conductive paste shrinks when being dried, the intaglio 11 is filled with the conductive paste and dried repeatedly until the dent at the paste has a depth of 5 μm or less. At step 1a, an adhesive layer 14 composed mainly of thermoplastic resin is applied on a heat-resistant substrate 13 capable of resisting against a temperature of 150° C. or higher having a thickness of approximately 1 to 10 μm. At step 1b, the intaglio 11 filled with the conductive paste 12 is heat-pressed onto the heat-resistant substrate 13. At step 1c, the intaglio 11 is separated from the heat-resistant substrate 13 after the conductive paste 12 is transfer-printed. At step 1d, an un-sintered ceramic GS 15 is stacked onto the heat-resistant substrate 13 at a side having the conductive paste 12 transfer-printed by being heat-pressed onto the side. At step 1e, the heat-resistant substrate 13 is separated from the GS 15. At this moment, the conductive pattern 12 is embedded onto the GS 15, and thus, is transfer-printed again and secured. At step 1f, the GS 15 having the transfer-printed conductive pattern 12 has a binder removed and is sintered. Then, the GS 15 becomes a sintered ceramic substrate 17, and the conductive paste 12 becomes a sintered conductive pattern 16.

As described above, the conductive pattern is easily formed on the un-sintered ceramic green sheet by the film-intaglio-transfer-printing method.

(Embodiment 2)

Figure 2:
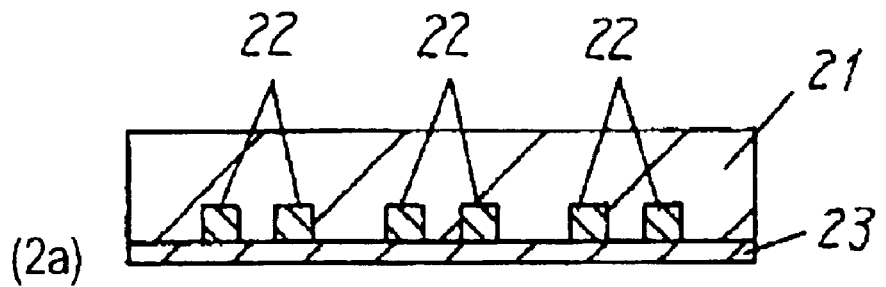
FIG. 2 illustrates sectional views of a ceramic substrate in a manufacturing process according to Embodiment 2 of the invention.
Figure 2:
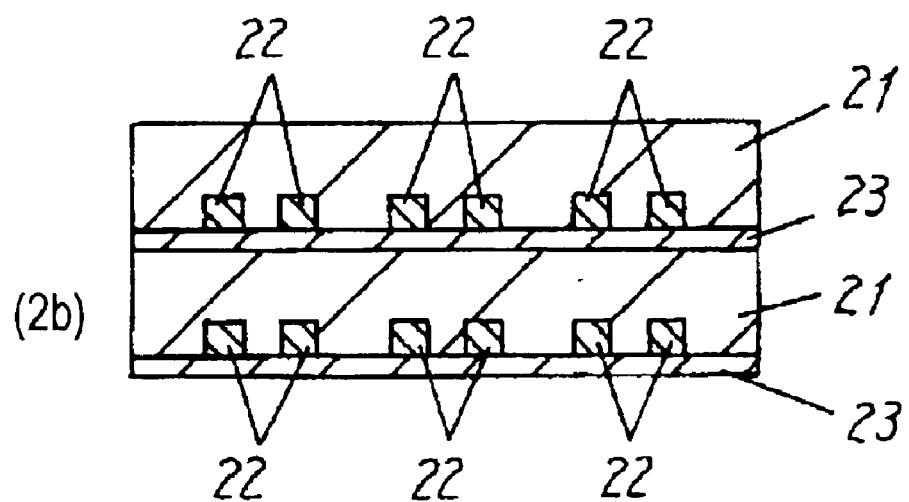
Figure 2:
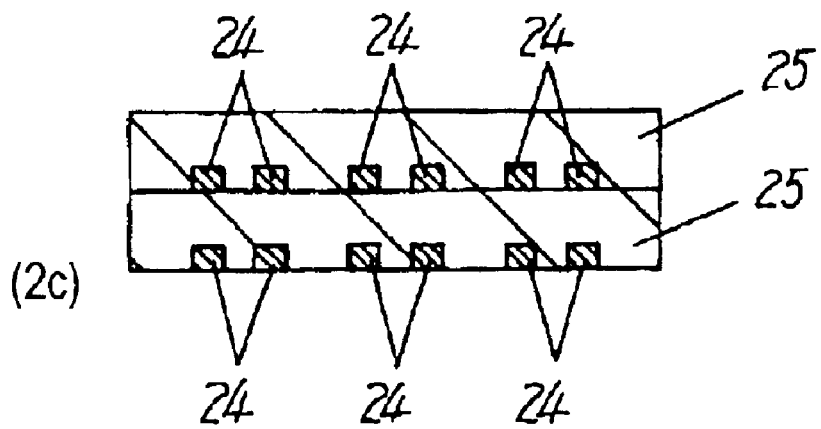

FIG. 2 shows processes of manufacturing a ceramic multi-layer circuit substrate in accordance with exemplary embodiment 2 of the present invention. In FIG. 2, an un-sintered ceramic green sheet (hereafter referred to as GS) having a conductive patterns formed thereon by a film-intaglio-transfer-printing method described in embodiment 1.

At step 2a, a GS 21 having a conductive pattern formed thereon by the film-intaglio-transfer-printing method is coated with an adhesive 23 on the side having a conductive paste 22. At step 2b, a necessary number of the GS's 21 are stacked by heat-pressing for being integrated. At step 2c, the stacked GS's have a binder removed and is sintered. The GS's 21 upon shrinking after the sintering, becomes sintered ceramic substrates 25, and the conductive paste 22 similarly becomes a sintered conductive pattern 24. The adhesive 23 is burnt off during the sintering. The sintered ceramic substrates 25 are coupled tightly with each other.

As described above, according to embodiment 2, a ceramic multi-layer circuit substrate is easily manufactured with un-sintered ceramic green sheets having conductive patterns formed by the film-intaglio-transfer-printing method.

(Embodiment 3)

Figure 3:
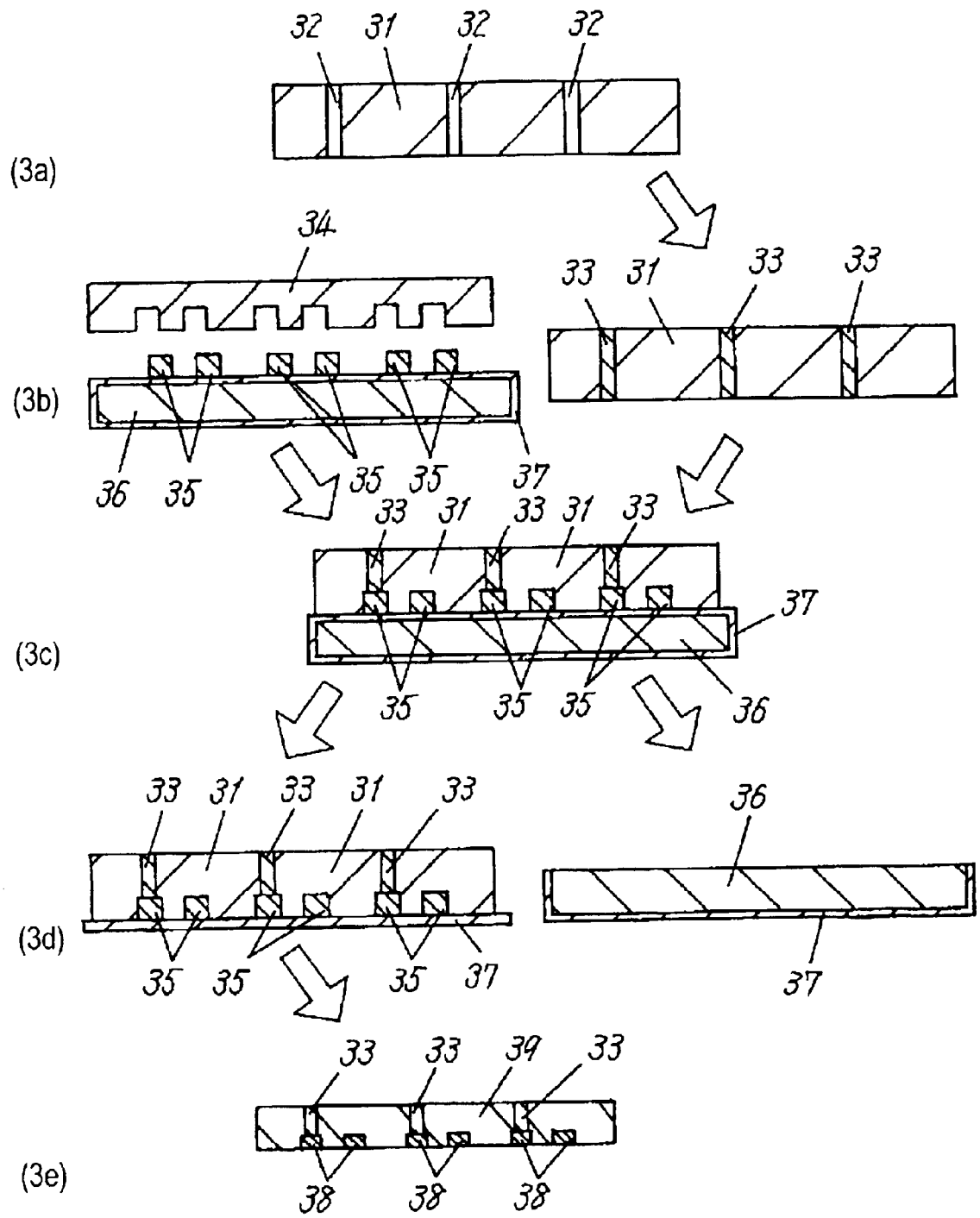
FIG. 3 illustrates sectional views of a ceramic substrate in a manufacturing process according to Embodiment 3 of the invention.

FIG. 3 shows a method of manufacturing a ceramic circuit substrate in accordance with exemplary embodiment 3 of the invention. A conductive pattern is formed on an un-sintered ceramic green sheet (hereafter referred to as GS) having a via conductor formed by the film-intaglio-transfer-printing method.

At step 3a, a through-hole 32 is formed in a GS 31 with a puncher or the like. At step 3b, a conductive pattern 35 formed with an intaglio 34 is transfer-printed onto a heat-resistant substrate 36 having surfaces coated with an adhesive layer 37. At step 3b, a via conductor 33 is formed in the through-hole 32 of the GS 31. At step 3c, the GS 31 having the via conductors 33 is heat-pressed onto the heat-resistant substrate 36 having the conductive patterns 35 formed by the film-intaglio-transfer-printing method. At step 3d, the heat-resistant substrate 36 is separated from the GS 31. Then, the conductive pattern 35 formed by the film-intaglio-transfer-printing method is attached on GS 31 with being embedded in the GS, and additionally, the adhesive layer 37 on the heat-resistant substrate 36 is attached onto the GS. At step 3e, the GS 31 has a binder removed and is sintered. The GS 31 shrinks after the sintering and becomes a sintered ceramic substrate 39, and the conductive pattern 35 similarly becomes a sintered conductive pattern 38.

(Embodiment 4)

Figure 4:
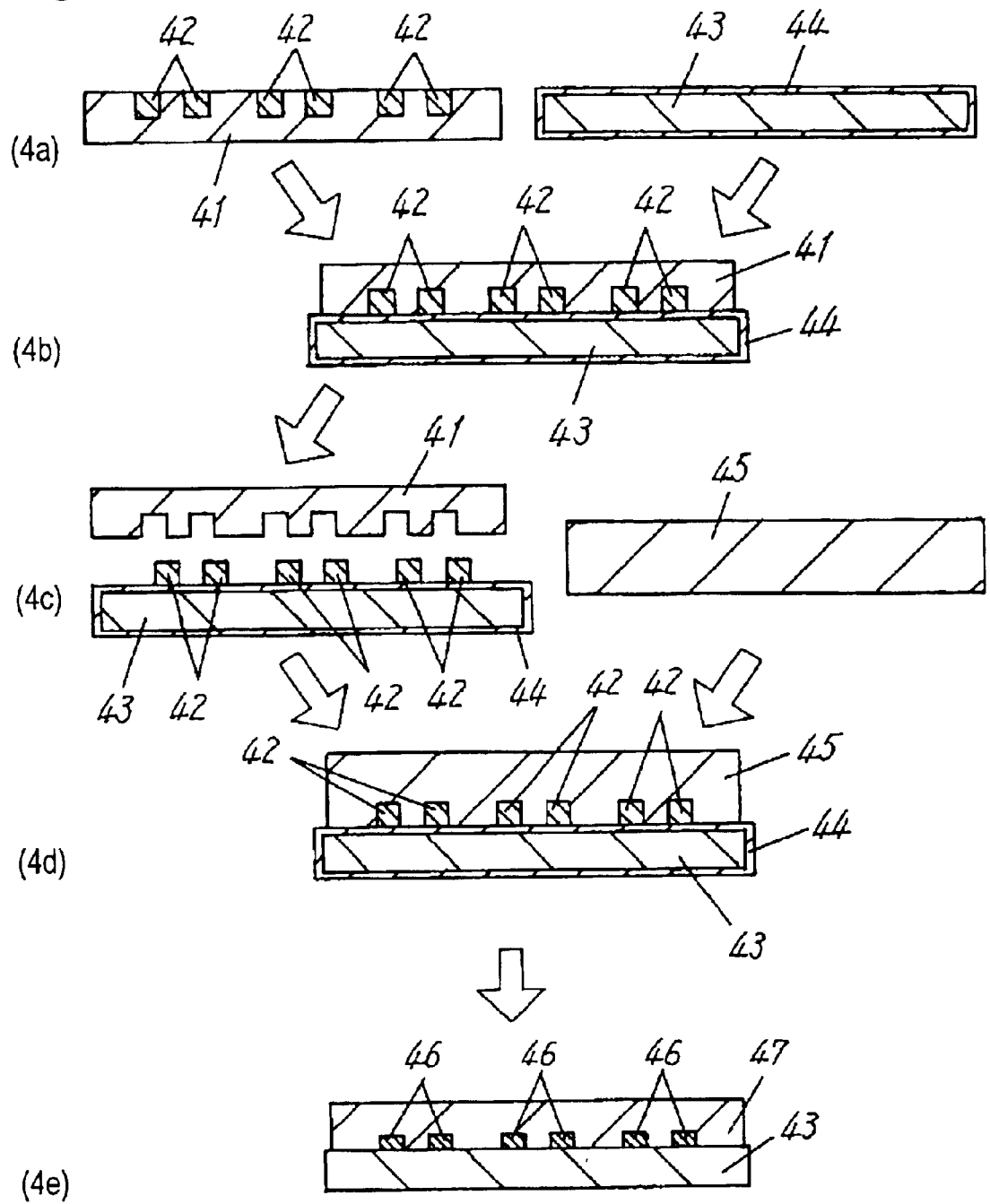
FIG. 4 illustrates sectional views of a ceramic substrate in a manufacturing process according to Embodiment 4 of the invention.

FIG. 4 shows a method of manufacturing a ceramic substrate in accordance with exemplary embodiment 4 of the present invention. An un-sintered ceramic green sheet (hereafter referred to as GS) is stacked a sintered ceramic substrate having conductive patterns formed thereon by a film-intaglio-transfer-printing method.

At step 4a, a polyimide intaglio 41 having a groove formed with excimer laser has the groove filled with conductive paste 42 with a ceramic blade or the like. As the volume of the conductive paste shrinks when being dried, the intaglio 41 is filled with the conductive paste and dried repeatedly until a dent at the paste has a depth of 5 μm or less. At step 4a, a sintered ceramic substrate 43 is coated with an adhesive layer 44 composed mainly of thermoplastic resin at a thickness of approximately 1 to 10 μm. At step 4b, the intaglio 41 filled with the conductive paste 42 is heat-pressed onto the sintered ceramic substrate 43. At step 4c, the intaglio 41 is separated from the sintered ceramic substrate 43 after the conductive paste 42 is transfer-printed. At step 4d, the GS 45, upon being heat-pressed onto the substrate 43, is stacked on the sintered ceramic substrate 43 at the side where the conductive paste 42 is transfer-printed. In this process, the un-sintered ceramic GS 45 and sintered ceramic substrate 43, since bonded more sufficiently with the adhesive layer 44, do not remove form each other. At step 4e, the GS 45 has a binder removed and is sintered. The adhesive layer 44 coated on the sintered ceramic circuit substrate 43 is burnt off during the sintering. After the sintering, the GS 45 shrinks, and thus, becomes a sintered ceramic substrate 47, and the conductive paste 42 becomes a sintered conductive circuit pattern 46. The ceramic circuit substrate manufactured by this method exhibits little shrinkage in a direction in its surface, but exhibits large shrinkage in a direction of its thickness.

(Embodiment 5)

Figure 5:
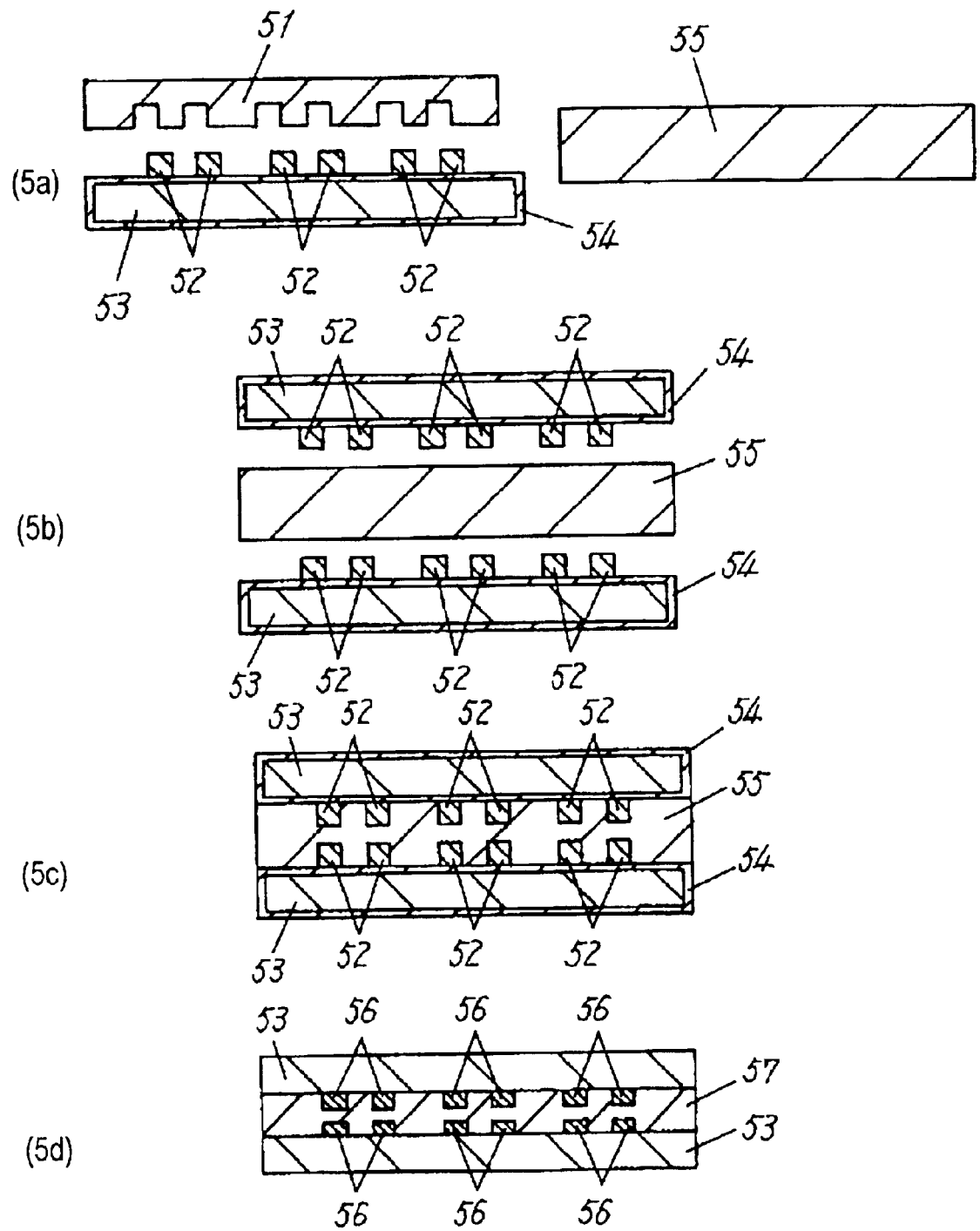
FIG. 5 illustrates sectional views of a ceramic substrate in a manufacturing process according to Embodiment 5 of the invention.

FIG. 5 shows a method of manufacturing a ceramic substrate in accordance with exemplary embodiment 5 of the present invention. Un-sintered ceramic green sheets (hereafter referred to as GS) and sintered ceramic substrates having conductive patterns formed by a film-intaglio-transfer-printing method are alternatively stacked.

At step 5a, a conductive paste 52 filled in a grooves of an intaglio 51 is transfer-printed onto a sintered ceramic substrate 53 coated with an adhesive layer 54. At step 5b, an un-sintered ceramic GS 55 is placed between the two sintered ceramic substrates 53 each having the conductive paste 52 formed by the-film-intaglio-transfer-printing method. At step 5c, the stacked structures are heat-pressed for being integrated. Consequently, a thickness (protrusion) of the conductive paste 52 formed on the sintered ceramic substrate 53 is embedded in GS 55 like being absorbed. At step 5d, the GS has a binder removed and is sintered. The Adhesive layer 54 coated on the sintered ceramic substrate 53 is burnt-off during the sintering. After being sintered, the GS 55 shrinks and becomes a sintered ceramic substrate 57, and the conductive paste 52 becomes a sintered conductive pattern 56.

As described above, the sintered ceramic substrates 53 and un-sintered ceramic green sheet 57 can be sintered together with the the adhesive layer. That is, the sintered ceramic substrate 53 and GS 57 can be bonded together with the adhesive, and thus, a multi-layer ceramic substrate having the sintered ceramic circuit board 53 and GS 57 combined with each other can be manufactured.

(Embodiment 6)

Figure 6:
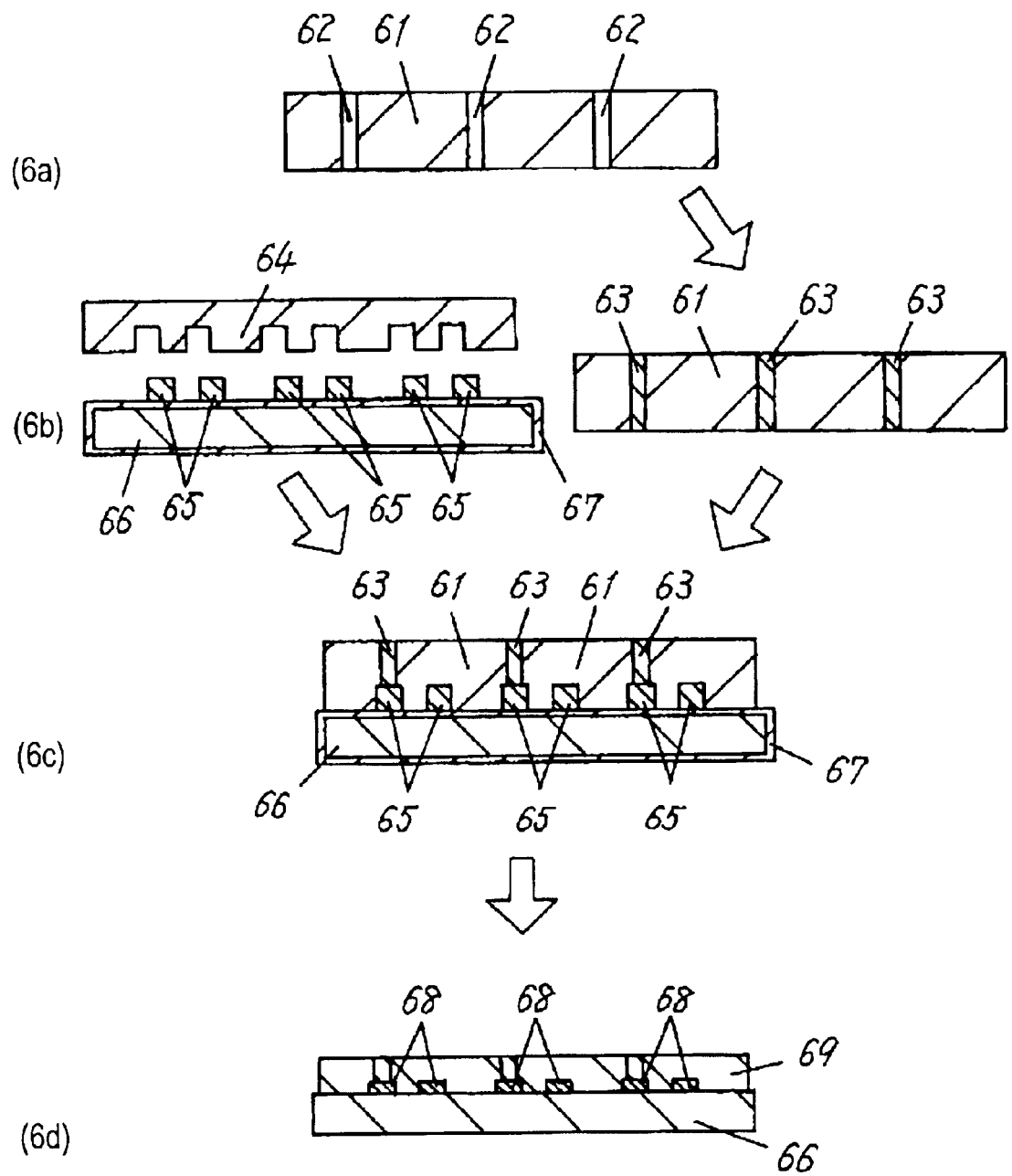
FIG. 6 illustrates sectional views of a ceramic substrate in a manufacturing process according to Embodiment 6 of the invention.

FIG. 6 shows a method of manufacturing a ceramic circuit substrate in accordance with exemplary embodiment 6 of the present invention. An un-sintered ceramic green sheet (hereafter referred to GS) having a via conductor is stacked on a sintered ceramic substrate having a conductive patterns formed by a film-intaglio-transfer-printing method.

At step 6a, a through-hole 62 is punched in a GS 61 with a puncher or the like. At step 6b, a conductive pattern 65 formed on an intaglio 64 is transfer-printed onto a sintered ceramic substrate 66 coated with an adhesive layer 67. Additionally, at step 6b, a via conductor 63 is formed in the through-hole 62 of the GS 61. At step 6c, the GS 61 having the via conductor 63 is heat-pressed onto the sintered ceramic substrate 66 having the conductive pattern 65 formed by the film-intaglio-transfer-printing method. The conductive pattern 65 formed by the film-intaglio-transfer-printing method is adhered on the GS 61 with being embedded. At step 6d, the GS has a binder removed and is sintered. The adhesive layer 67 coated on a sintered ceramic substrate 66 is burnt-off during the sintering. After being sintered, the un-sintered GS 61 shrinks and becomes a sintered ceramic substrate 69, and similarly, the conductive circuit 65 becomes a sintered conductive pattern 68.

As described above, a ceramic circuit substrate formed with stacked un-sintered ceramic green sheets having a via conductor placed on a sintered ceramic substrate is easily manufactured (Embodiment 7)

Figure 7:
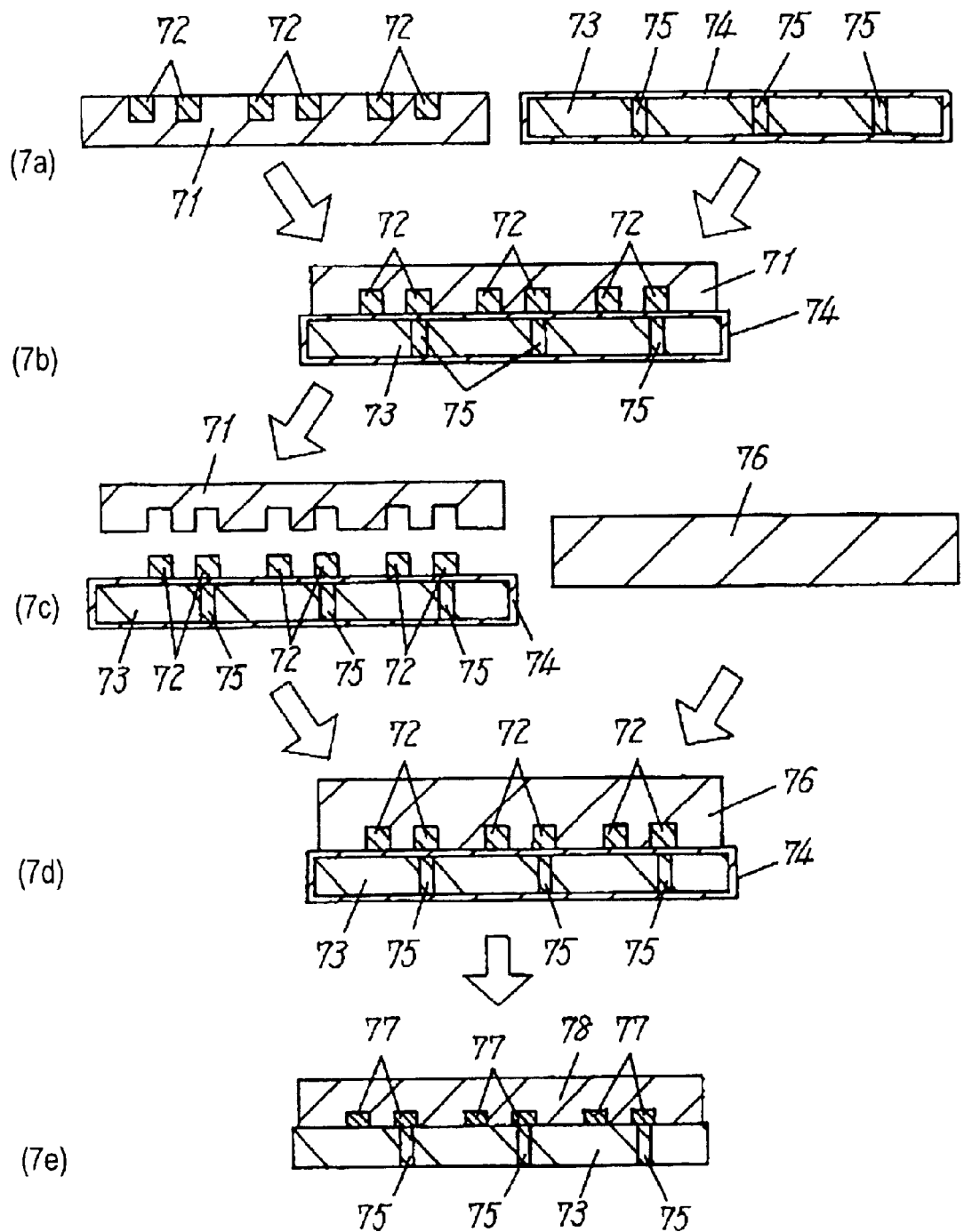
FIG. 7 illustrates sectional views of a ceramic substrate in a manufacturing process according to Embodiment 7 of the invention.

FIG. 7 shows a method of manufacturing a ceramic circuit substrate in accordance with exemplary embodiment 7 of the present invention. A conductive pattern is formed on a sintered ceramic circuit substrate having a via conductor provided in a through-hole by the a film-intaglio-transfer-printing method. An un-sintered ceramic green sheet (hereafter referred to as GS) is stacked on the substrate to be integrated.

At step 7a, a polyimide intaglio 71 is filled with conductive paste 72 into a groove formed by excimer laser with a ceramic blade or the like. As a volume of the conductive paste shrinks when being dried, the intaglio is repeatedly filled with conductive paste and dried until the depth at the paste becomes 5 µm pr less. At step 7a, the via conductor 75 are provided in the through-hole formed in a sintered ceramic substrate 73. Subsequently, the substrate 73 is coated with an adhesive layer 74 composed mainly of thermoplastic resin at a thickness ranging approximately 1–10 µm. At step 7b, the intaglio 71 filled with the conductive paste 72 is heat-pressed onto the sintered ceramic substrate 73. At step 7c, the intaglio 71 is separated from the sintered ceramic substrate 73 after the conductive paste 72 is transfer-printed. At step 7d, an un-sintered ceramic GS 76 is heat-pressed onto the sintered ceramic substrate 73 where the conductive paste 72 is transfer-printed. In this heat-pressing process, the un-sintered ceramic GS 76 and sintered ceramic substrate 73, since both being bonded securely with the adhesive layer 74, do not remove from each other. At step 7e, the GS has a binder removed and is sintered. The Adhesive layer 74 coated on the sintered ceramic substrate 73 is burnt-off during the sintering. The GS 76 shrinks and becomes a sintered ceramic substrate 78, and similarly, the conductive paste 72 becomes a sintered conductive pattern 77. The ceramic substrate manufactured by this method exhibits little shrinkage in a direction in a plane. Thus, the GS shrinks in a thickness direction larger than in a stacking direction.

As described above, according to embodiment 7, a ceramic circuit substrate is easily manufactured from stacked un-sintered ceramic green sheets having a via conductor placed on a sintered ceramic substrate having a via conductor.

(Embodiment 8)

Figure 8:
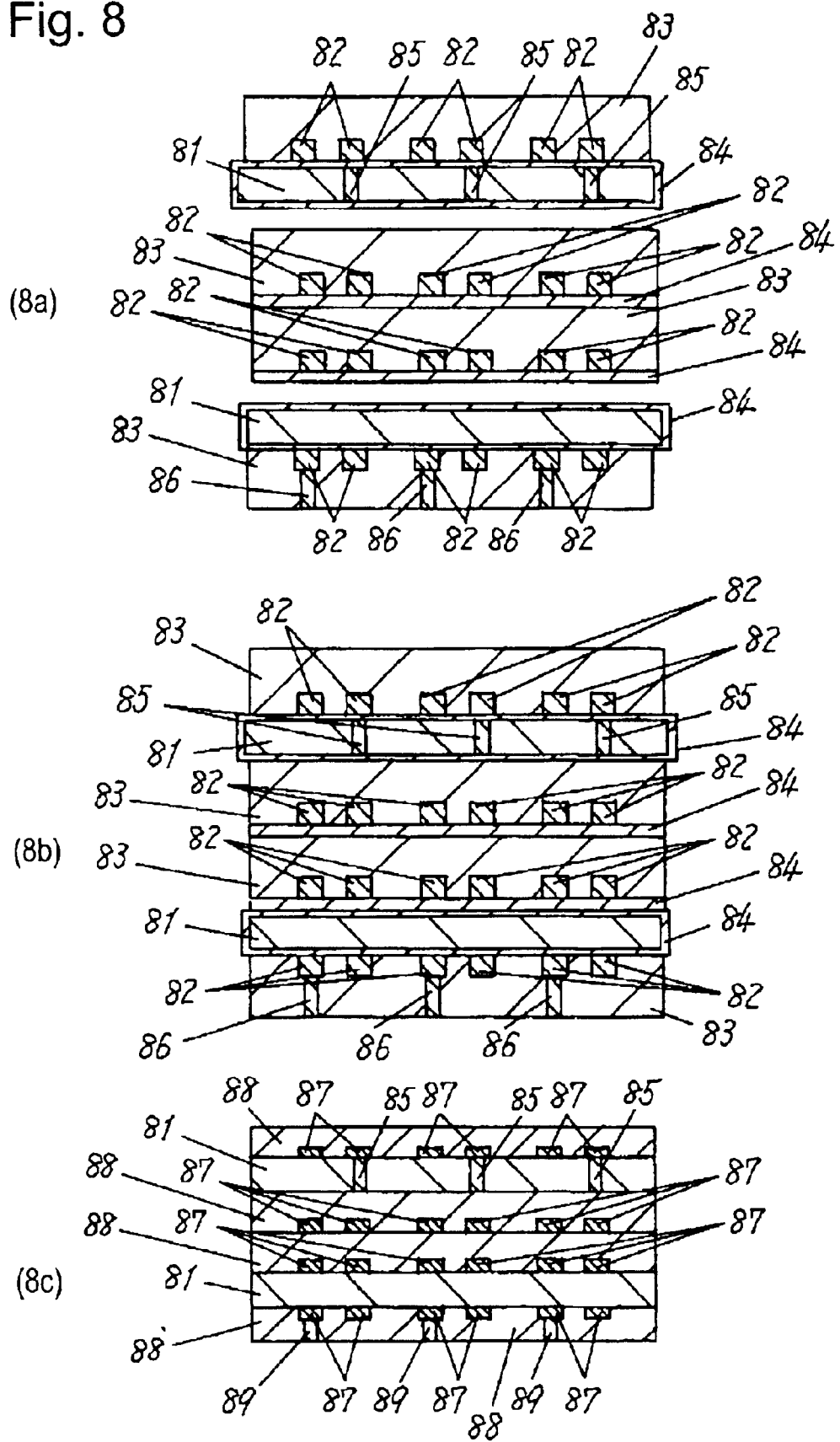
FIG. 8 illustrates sectional views of a ceramic substrate in a manufacturing process according to Embodiment 8 of the invention.
Figure 9:
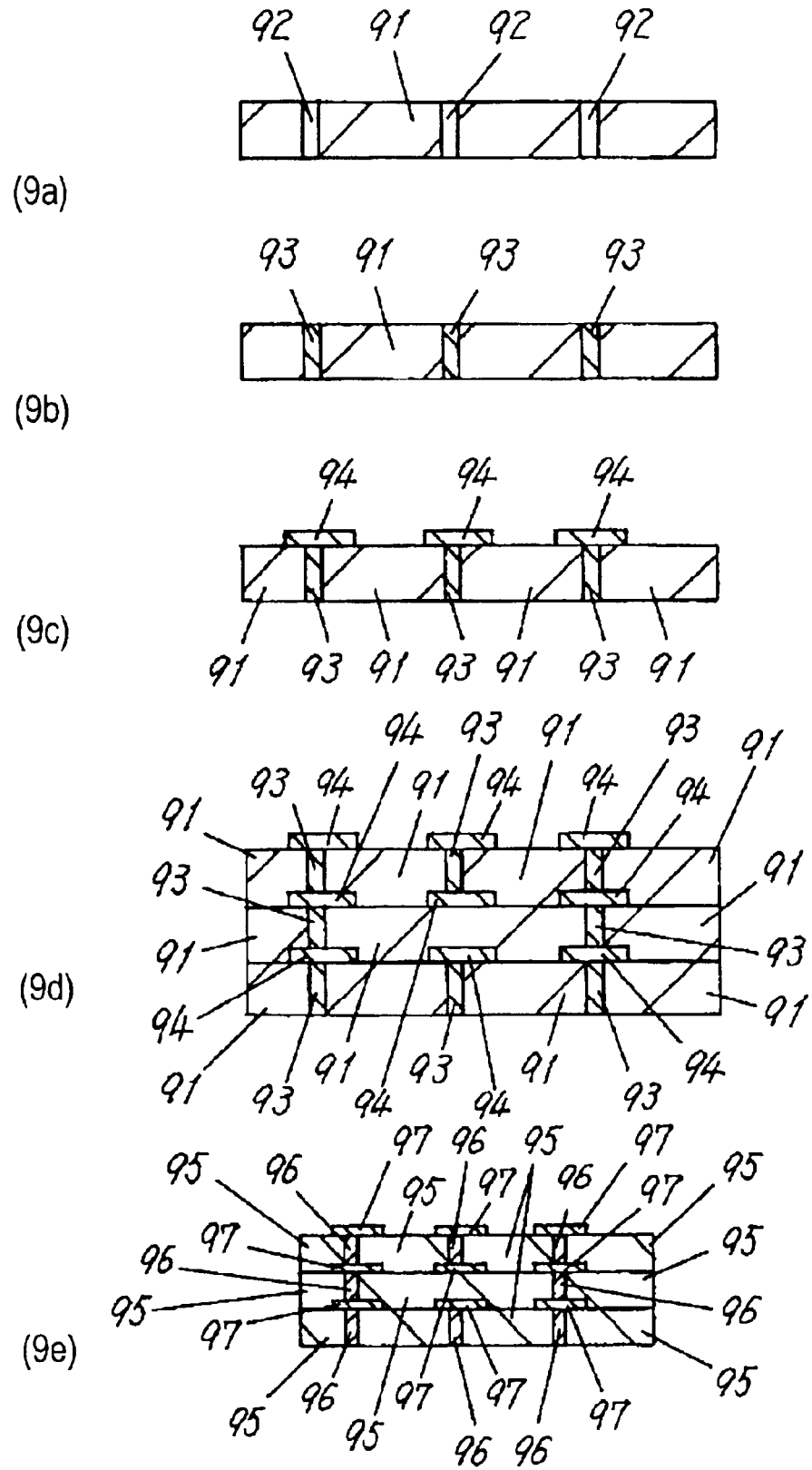
FIG. 9 illustrates sectional views of a ceramic substrate in a conventional manufacturing process.

FIG. 8 shows a method of manufacturing a ceramic circuit substrate in accordance with exemplary embodiment 7 of the present invention. A sintered ceramic substrate having a conductive pattern formed by a film-intaglio-transfer-printing method and an un-sintered ceramic green sheet (GS) are stacked for being integrated.

At step 8a, three ceramic substrates used in the manufacturing method of this embodiment, that is, the first ceramic substrate manufactured through step 7d in embodiment 7, the second ceramic substrate manufactured through step 2b in embodiment 2, and the third ceramic substrate manufactured through step 6c in embodiment 6. In the first ceramic substrate, a GS 83 is stacked on a sintered ceramic substrate 81 having a via conductor 85 and conductive paste 82 formed by the film-intaglio-transfer-printing method. In the second ceramic substrate, a conductive pattern 82 is formed on the GS 83 by the film-intaglio-transfer-printing method. In the third ceramic substrate, the GS 83 having a via conductor 86 is stacked on a sintered ceramic substrate 81 having a conductive paste 82 formed by the film-intaglio-transfer-printing method. At step 8b, the three substrates are stacked, heat-pressed for being integrated. The sintered ceramic substrate 81 and GS 83 are especially bonded easily with an adhesion layer 84. At step 8C, the GS has a binder removed and is sintered. The adhesive layer 84 coated on the sintered ceramic substrate 81 is burnt-off during the sintering. The GS 83 shrinks, and then, becomes a sintered ceramic substrate 88, and the conductive paste 82 becomes a sintered conductive pattern 87. The via conductor 86 formed on the GS 83 shrinks in the sintering together with the GS 83, then becomes a via conductor 89.

In embodiment 8, as shown at step 8a, the sintered ceramic substrate 81 and GS 83, both which are previously integrated, are stacked to another substrate for being integrated. Instead of being previously integrated, the sintered ceramic substrate 81 and GS 83, for example, may be integrated in a single operation at step 8b. Additionally, various kinds of multi-layer ceramic substrates can be manufactured by combined methods among those according to embodiments 1 to 7.

Examples according to the present invention will be explained below.

EXAMPLE 1

Example 1 will be explained according to FIG. 1. In the film-intaglio-transfer-printing method, a heat-resistant film such as polyimide is used for the intaglio. A groove for the conductive pattern is formed on the film with excimer laser or the like. A parting treatment is provided with the film to be easily peeled off after the transfer-printing. With a rigid squeegee, the groove is filled with conductive paste to form the conductive pattern. A paste containing silver, since being capable of being sintered at a temperature of 850–900° C., is used as the conductive paste. The intaglio filled with the paste is dried in a drier for 5–10 minutes at a temperature of 100–150° C. The conductive paste filled in the groove shrinks in volume due to volatile evaporation of solvent in the paste. The intaglio has the groove filled with the conductive paste and is dried repeatedly until the depth at the paste from the no-groove formed surface of the intaglio becomes 5 μm or less. Then, an adhesive layer composed mainly of thermoplastic resin is applied by, for example, a dipping method, screen printing method or spinner method, on the heat-resistant substrate made of, for example, a bake plate, metal plate or ceramic board or the like which does not deform under a drying temperature of approximately 150° C. A softening point of the adhesive layer is lower than that of resin used as an organic binder for the un-sintered ceramic green sheet. From the intaglio filled with the conductive paste on the heat-resistant substrate coated with the adhesive layer, the conductive pattern is transfer-printed temporarily onto the heat-resistant substrate by the film-intaglio-transfer-printing method. In this process, a heat-pressing temperature is higher than the softening point of the adhesive layer but lower than 150° C. At this moment, a pressure of 30 to 80 kg/cm$^2$, and its applying time of 3 to 10 minutes, are adjusted according to a status of the conductive pattern.

Then, the conductive pattern is transfer-printed on the GS when the unfired ceramic GS is heat-pressed onto the heat-resistant substrate having the conductive patterns. Consequently, a surface of GS is provided with a fine conductive pattern formed by the film-intaglio-transfer-printing method. In this process, a heat-pressing temperature is necessarily higher than a softening point of the adhesive layer but lower than a critical point of heat deformation of the GS (approximately 150° C.).

At this moment, a pressure of 50 to 150 kg/cm$^2$ and its applying time of 3 to 10 minutes are adjusted according to a status of the conductive pattern. The GS has the binder removed and is sintered, thus proving a ceramic circuit substrate having a high-density conductive pattern. The GS, upon being made of, for example, ™KLS-1000 (Nihon Denki Glass Co., Ltd.), can be processed at a binder-removing temperature of 400 to 500° C. and a sintering temperature of 900° C., so that little residual carbon may not remain in the GS

EXAMPLE 2

Example 2 will be explained according to FIG. 2. Two or more ceramic green sheets (hereafter referred to as GS) both subjected to the film-intaglio-transfer-printing method in example 1 are heat-pressed. In this process, the heat pressing temperature is necessarily higher than a softening point of the adhesive layer but lower than a non-deformation temperature of the GS (approximately 100° C.). A pressure of 50 to 100 kg/cm$^2$ and its applying time of 3 to 10 minutes are adjusted according to a status of the conductive pattern. A multi-layer ceramic circuit substrate having a high-density conductive pattern is manufactured after the GS has the binder removed and is sintered.

EXAMPLE 3

Example 3 will be explained according to FIG. 3. A ceramic green sheet (hereafter referred to as GS) which is not subjected to the transfer-printing by the film-intaglio-transfer-printing method in example 1 has a through hole with a puncher. Having the through-hole filled with conductive paste by a screen printing method with a metal plate, the GS is dried under its heat deformation temperature of 60–100° C.). Then, similarly to example 1, the GS having the via conductor and a heat-resistant substrate having a conductive paste temporarily transfer-printed are heat-pressed, thus transfer-printing the conductive paste again on the GS having the via conductor. Then, having the heat-resistant substrate removed, the GS having the conductive pattern and via conductor is manufactured. By this method, a ceramic circuit substrate having high-density conductive patterns connected between layers and via connection can be manufactured.

EXAMPLE 4

Example 4 will be explained according to FIG. 5. In the film-intaglio-transfer-printing method, a heat-resistant film such as a polyimide film is used for the intaglio. The film for the intaglio has a groove for a conductive pattern formed with excimer laser or the like. A parting treatment is applied to the film to be easily peeled off after a transfer-printing. The Groove for the conductive patterns is filled with conductive paste with using a rigid squeegee. As the conductive paste, paste containing silver, which can be sintered at a temperature of 850–900° C., is used. An intaglio filled with the conductive paste is dried in a drier for 5–10 minutes at a temperature of 100–150° C. The conductive paste filled into the groove shrinks in volume due to volatile evaporation of solvent in the paste. The groove is filled with the conductive paste and dried repeatedly until the depth at the paste from the upper surface not having the groove on the GS becomes 5 μm or less. Then, the sintered ceramic substrate is coated with an adhesive layer mainly composed of thermoplastic resin at a thickness ranging 1 to 10 μm. by, for example, a dipping method, screen printing method, or spinner method. A softening point of the adhesive layer is lower than that of resin used as an organic binder for the un-sintered ceramic green sheet. The intaglio film filled with the conductive paste on the sintered ceramic substrate coated with the adhesive layer, and then, a conductive pattern is transfer-printed on the sintered ceramic substrate by heat-pressing. Its heat-pressing temperature is necessarily higher than a softening point of the adhesive layer. A pressure of 30 to 80 kg/cm$^2$ and its applying time of 3 to 10 minutes are adjusted according to a status of the conductive pattern.

The sintered ceramic substrate, upon having the adhesive layer on sides thereof, provided on both sides with intaglio films which are filled with the conductive paste, so that the conductive patterns may be transfer-printed on both sides of the substrate. Then, an un-sintered ceramic green sheet (hereafter referred to as GS) is heat-pressed onto the sintered ceramic substrate having the conductive patterns to be integrated. In this process, a heat pressing temperature is required to be higher than a softening point of the adhesive layer but lower than a critical point for heat deformation of the GS (approximately 100° C.). In this heat-pressing process, a pressure of 50 to 150 kg/cm$^2$ and its applying time of 3 to 10 minutes are adjusted according to a status of the conductive patterns.

Then, the GS has the binder removed and is sintered, thus providing a ceramic circuit substrate having a high-density conductive pattern. The GS, upon being, for example, KLS-1000™ (Nihon Denki Glass Co., Ltd.), is processed at the binder removing temperature of 400–500° C. and the sintering temperature of 900° C., so that little residual carbon can be remained in the GS Thus, a un-sintered ceramic green sheet and sintered ceramic circuit substrate having a conductive pattern are stacked and heat-pressed to be integrated, and then, has a binder removed and is sintered, thus providing a ceramic circuit substrate having high-density conductive patterns easily manufactured

EXAMPLE 5

Two sintered ceramic substrates having high-density conductive patterns in example 4 are stacked on both sides of a GS, and then, heat-pressed to be integrated, and has a binder removed and is sintered. This provides a ceramic circuit substrate having a high-density conductive pattern.

EXAMPLE 6

A GS having a through-hole formed with a puncher or the like and provided with a via conductor formed by a screen printing method or the like is used as a GS in example 5. This provides a ceramic circuit substrate having a high-density conductive pattern electrically connected between layers therein

EXAMPLE 7

A sintered ceramic substrate having a via conductor formed in a through-hole previously made is used as a sintered ceramic substrate in example 5. This provides a ceramic circuit substrate having high-density conductive patterns formed on both sides of the substrate and electrically connected to each other.

EXAMPLE 8

A GS having a conductive pattern formed by a film-intaglio-transfer-printing method is used instead of the GS in examples 4 to 7 provides a ceramic multi-layer circuit substrate having a high-density conductive pattern.

Industrial Applicability

As described above, according to the present invention, a ceramic circuit substrate having a multi-layer high-density conductive pattern can be easily manufactured by a film-intaglio-transfer-printing method.

What is claimed is:

1. A method for manufacturing a ceramic substrate, comprising the steps of:
    forming a conductive pattern through filling an intaglio with a conductive paste;
    forming an adhesive layer on a heat-resistant substrate;
    heat-pressing the intaglio onto the adhesive layer;
    removing the intaglio;
    forming a first assembly through stacking an un-sintered green sheet to cover the conductive pattern and through heat-pressing the un-sintered green sheet;
    forming a plurality of the first assemblies through repeating said steps of forming the conductive pattern, forming the adhesive layer; heat-pressing the intaglio, removing the intaglio, and forming the first assembly; and
    forming a second assembly through stacking the first assemblies.

2. The method of claim 1, further comprising the step of performing a binder-removing process and a sintering process to the first assembly.

3. The method of claim 1, further comprising the steps of:
    forming a via-conductor through forming a through-hole in the un-sintered green sheet; and
    connecting the conductive pattern to the via conductor.

4. The method of claim 1, further comprising the step of performing a binder-removing process and a sintering process to the second assembly.

5. The method of claim 1, further comprising the step of removing the first heat-resistant substrate from the conductor pattern.

6. The method of claim 5, wherein said removing the first heat-resistant substrate comprises removing the first heat resistant substrate from the conductor pattern and the un-sintered green sheet.

7. A method for manufacturing a ceramic substrate, comprising the steps of:
    forming a conductive pattern through filling an intaglio with a conductive paste;
    forming an adhesive layer on a sintered ceramic substrate;
    heat-pressing the intaglio onto the adhesive layer;
    removing the intaglio;
    forming a first assembly through stacking an un-sintered green sheet to cover the conductive pattern and through heat-pressing the un-sintered green sheet;
    forming a plurality of the first assemblies through repeating the steps of forming the conductive pattern, forming the adhesive layer, heat-pressing the intaglio, removing the intaglio, and forming the first assembly; and
    forming a second assembly through stacking the first assemblies and an un-sintered ceramic green sheet alternatively.

8. The method of claim 7, further comprising the step of performing a binder-removing process and a burning process to the first assembly.

9. The method of claim 7, further comprising the steps of:
    forming a via-conductor through forming a through-hole in the un-sintered green sheet; and
    connecting the conductive patterns to the via-conductor.

10. The method of claim 7, further comprising the steps of:
    forming a via-conductor through forming a through-hole in the sintered substrate; and
    connecting the conductive pattern to the via-conductor.

11. The method of claim 7, further comprising the step of performing a binder-removing process and a sintering process to the second assembly.

12. A method for manufacturing a ceramic substrate, comprising the steps of:
    forming a first conductive pattern through filling a first intaglio with a conductive paste;
    forming a first adhesive layer on a first heat-resistant substrate;
    heat-pressing the first intaglio onto the first adhesive layer;
    removing the first intaglio;
    forming a first assembly through stacking an un-sintered green sheet to cover the first conductive pattern and heat-pressing the un-sintered green sheet;
    forming a second conductive pattern through filling a second intaglio with a conductive paste;
    forming a second adhesive layer on a sintered ceramic substrate;

heat-pressing the second intaglio to the second adhesive layer;

removing the second intaglio; and forming a second assembly through stacking the first assembly to cover the second conductive pattern and heat-pressing the first assembly.

13. The method of claim 12, further comprising the step of performing a binder-removing process and a sintering process to the second assembly.

14. The method of claim 12, wherein the first intaglio and the second intaglio are identical to each other.

15. The method of claim 12, further comprising the steps of:

forming a first via-conductor through forming a through-hole in the un-sintered green sheet; and connecting at least one of the first and second conductive patterns to the first via-conductor.

16. The method of claim 12, further comprising the steps of:

forming a second via-conductor through forming a through-hole in the sintered ceramic substrate; and connecting at least one of said first and second conductive patterns to the second via-conductor.

* * * * *